US008760335B1

(12) United States Patent
Kappes

(10) Patent No.: US 8,760,335 B1
(45) Date of Patent: Jun. 24, 2014

(54) EXTERNALLY CONTROLLED DATA CONVERTER WITH CONFIGURABLE FUNCTIONS

(71) Applicant: IQ-Analog Corporation, San Diego, CA (US)

(72) Inventor: Michael Kappes, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/164,369

(22) Filed: Jan. 27, 2014

Related U.S. Application Data

(63) Continuation of application No. 14/050,434, filed on Oct. 10, 2013, now Pat. No. 8,711,026.

(51) Int. Cl.
  *H03M 1/12* (2006.01)
(52) U.S. Cl.
  CPC ........................................ *H03M 1/12* (2013.01)
  USPC .......................................... 341/155; 341/156
(58) Field of Classification Search
  CPC ....... H03M 1/12; H03M 1/00; H03M 1/1225; H03M 1/56; H03M 1/804
  USPC ......... 341/155, 156, 138, 141, 169, 122, 126, 341/132, 172; 375/340
  See application file for complete search history.

(56) References Cited

U.S. PATENT DOCUMENTS

| | | | |
|---|---|---|---|
| 7,561,090 B1 * | 7/2009 | Muenter et al. ................ | 341/155 |
| 8,335,484 B1 | 12/2012 | Arad | |
| 8,358,231 B2 | 1/2013 | Killat | |
| 8,368,571 B2 | 2/2013 | Siragusa | |
| 8,369,458 B2 * | 2/2013 | Wong et al. ................... | 375/340 |
| 8,462,030 B2 | 6/2013 | Muhammad | |
| 8,471,751 B2 | 6/2013 | Wang | |
| 8,519,876 B2 | 8/2013 | Lin | |
| 8,519,878 B2 | 8/2013 | Jensen | |
| 8,542,140 B2 | 9/2013 | Chen | |
| 8,542,142 B2 | 9/2013 | Stein | |
| 8,542,144 B2 | 9/2013 | Coban | |
| 2006/0119499 A1 * | 6/2006 | Brady et al. .................. | 341/155 |
| 2010/0283649 A1 | 11/2010 | Bos | |

* cited by examiner

*Primary Examiner* — Joseph Lauture
(74) *Attorney, Agent, or Firm* — Law Office of Gerald Maliszewski; Gerald Maliszewski

(57) ABSTRACT

A data converter module is provided with an analog interface to receive analog signals, a digital interface to transmit digital signals, and a configuration interface to accept configuration signals. The data conversion module also includes a data conversion array (DCA) with selectively engageable data conversion circuits for the conversion of analog input signals to digital output signals, where the data conversion circuits are responsive to the configuration signals. The DCA's data conversion circuits include configurable data resolution circuits and configurable data conversion speed circuits. For example, the configurable data resolution circuits may be selected from averaging, oversampling, and multi-stage pipelining circuits. The DCA configurable data speed circuit may interleave the outputs from multiple parallelly connected ADCs operating at different clock phases. In one aspect, the number of clock phases is selectable. Also provided are methods for configurable data conversion.

23 Claims, 10 Drawing Sheets

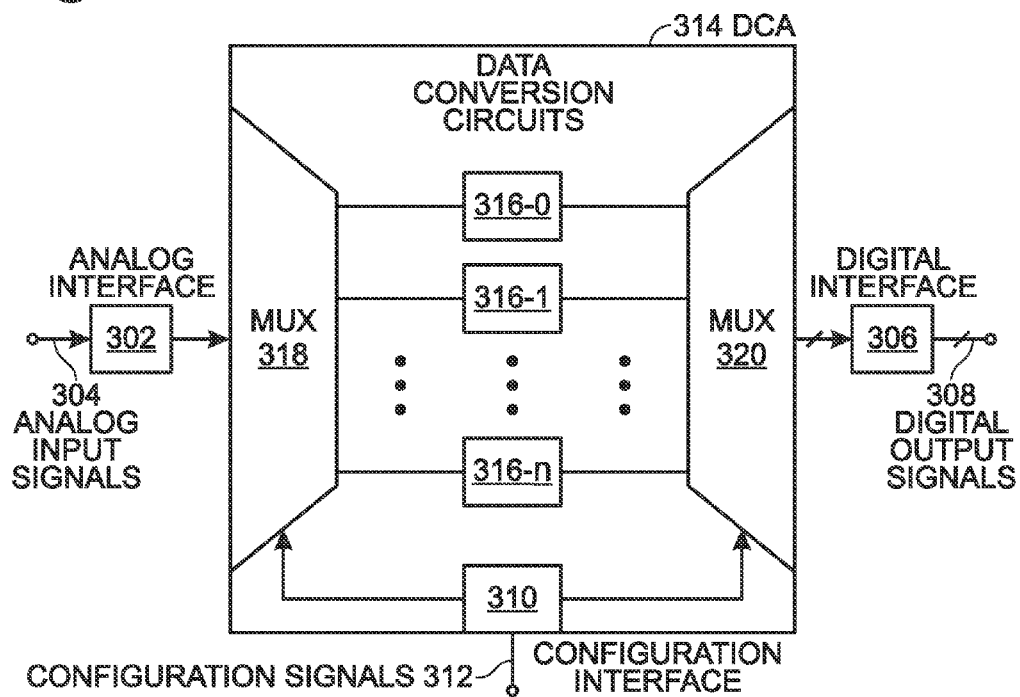
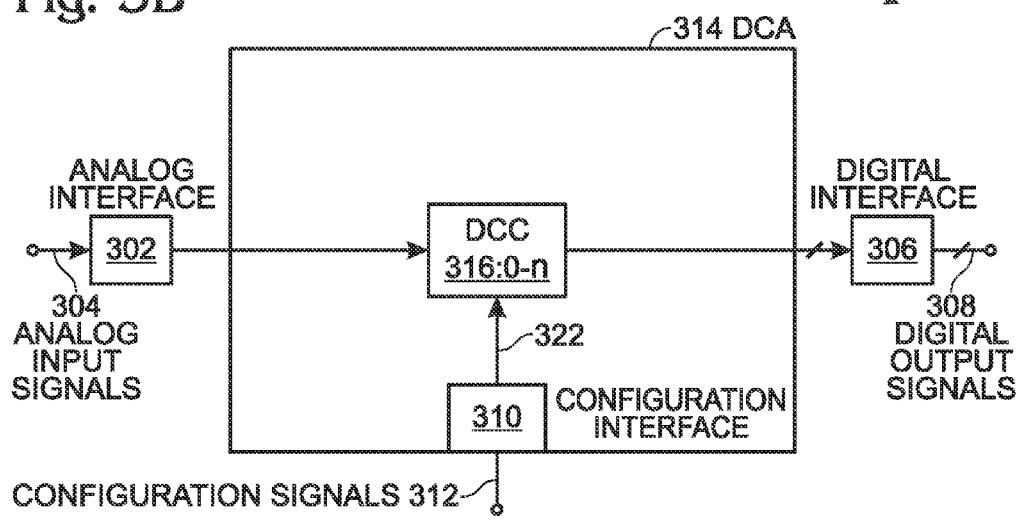

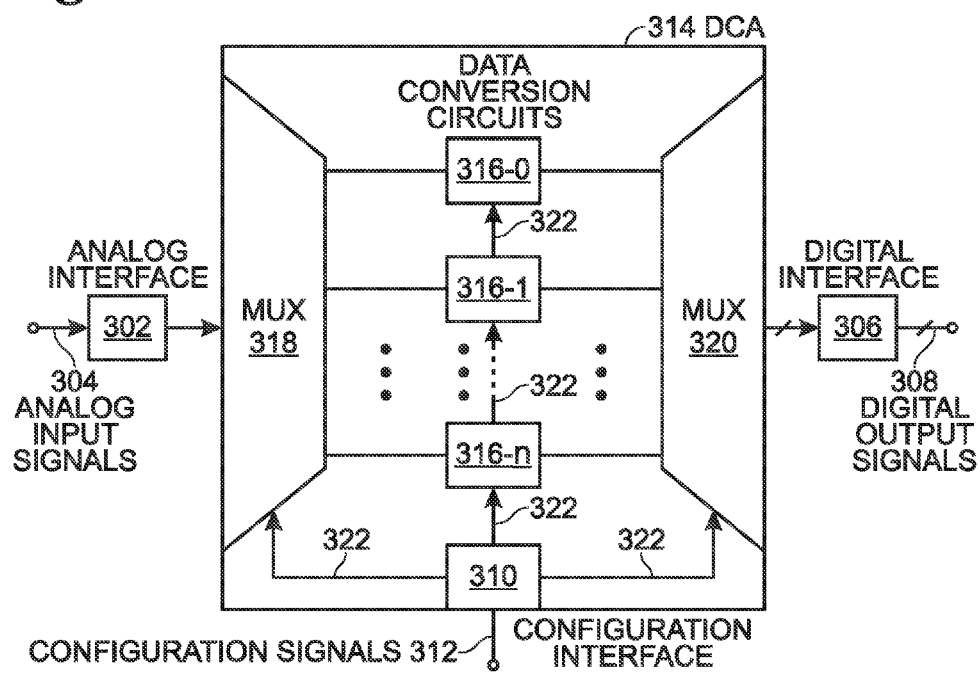
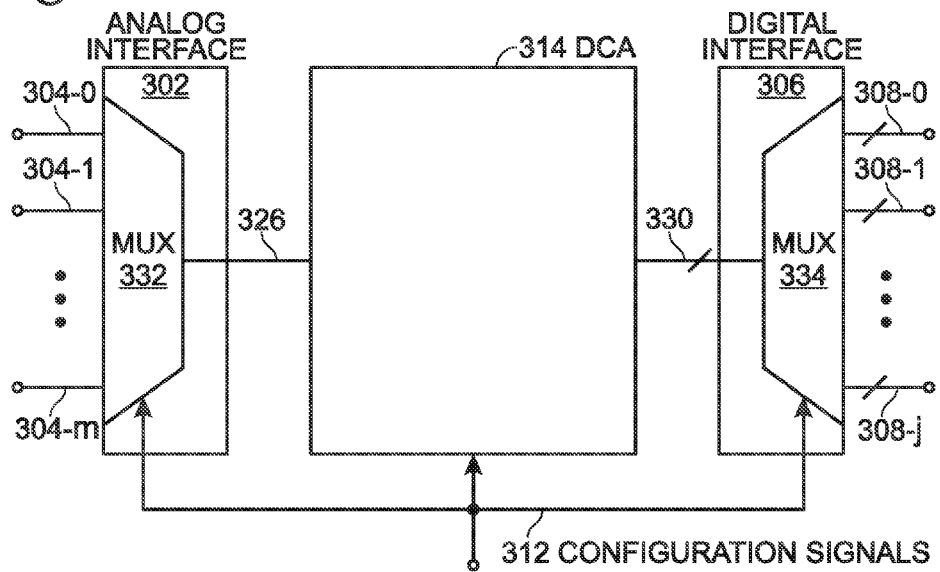

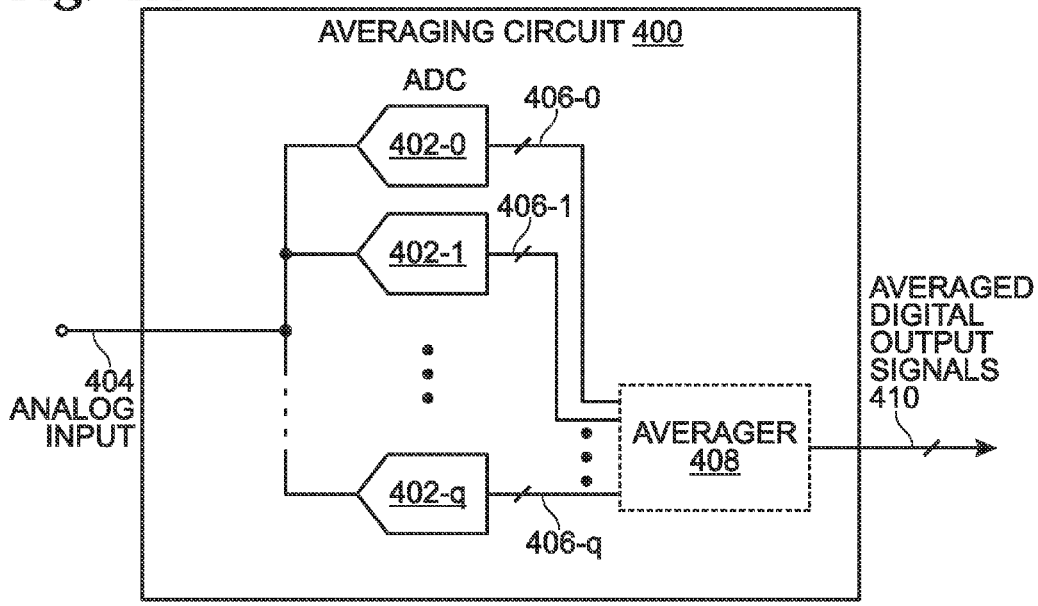

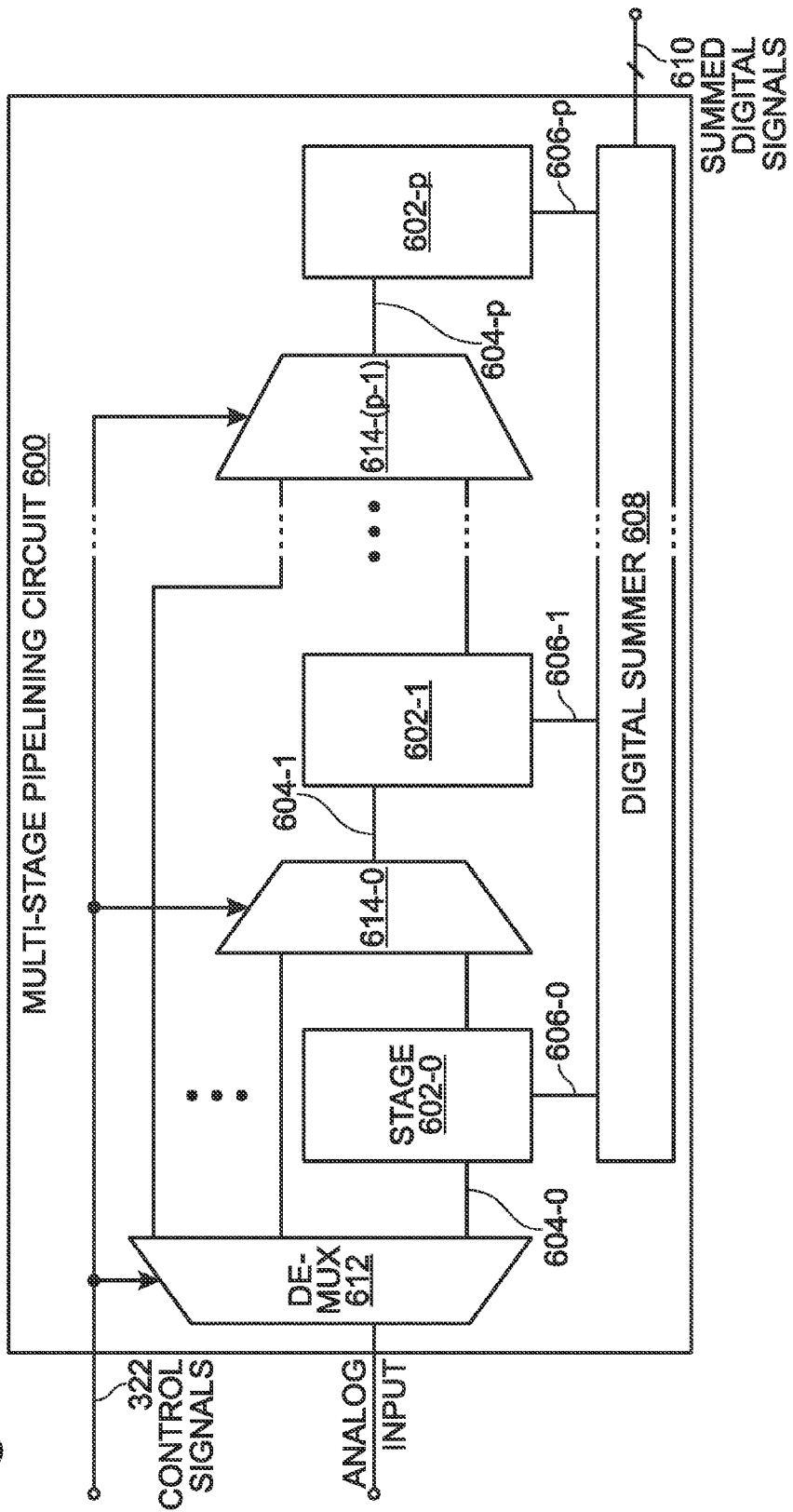

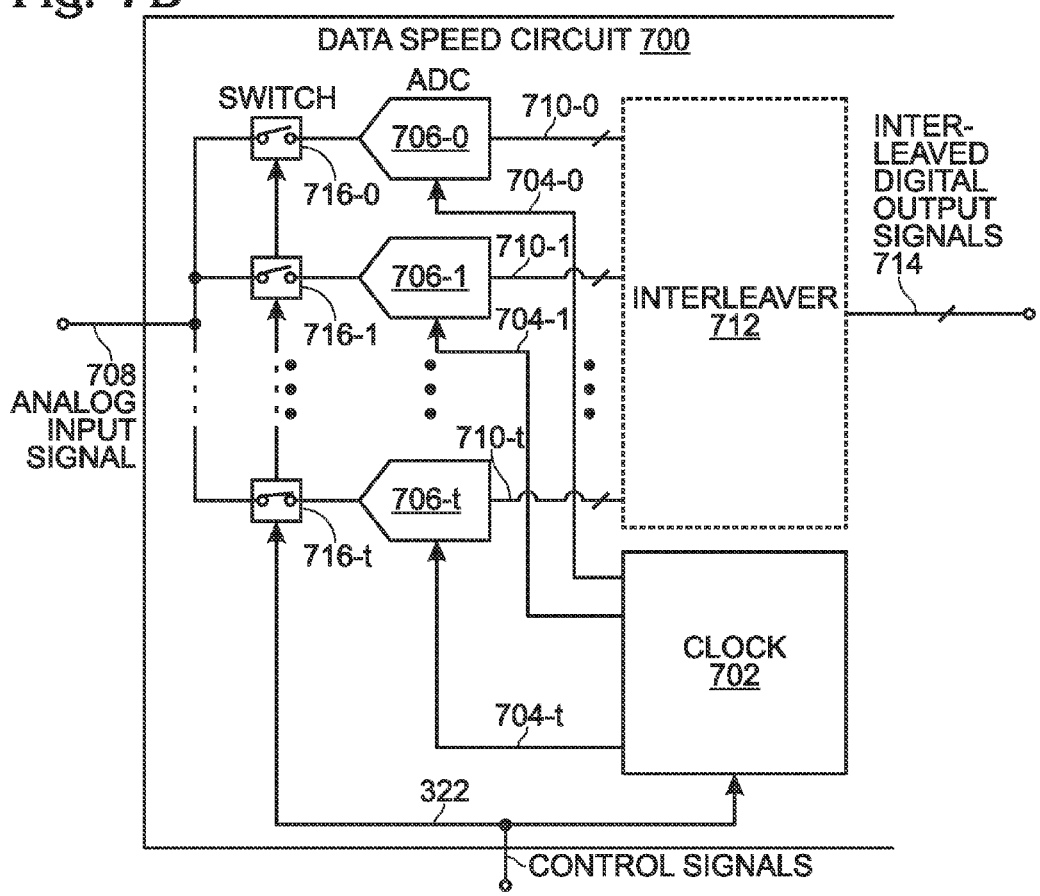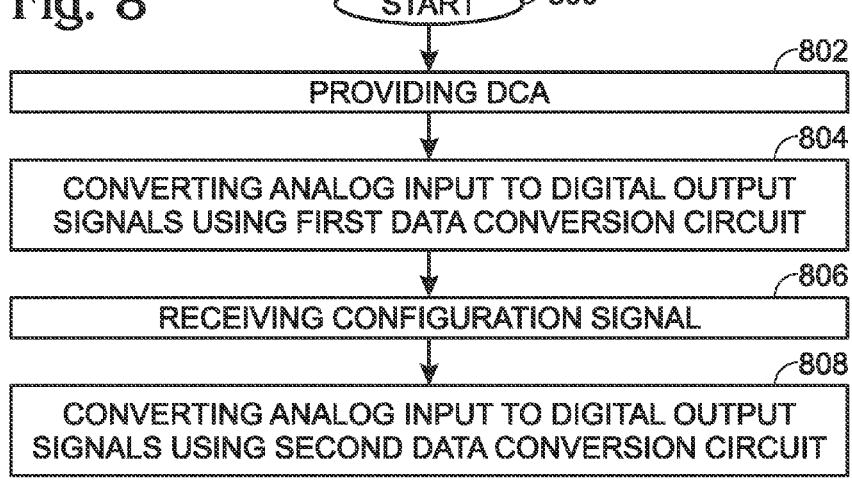

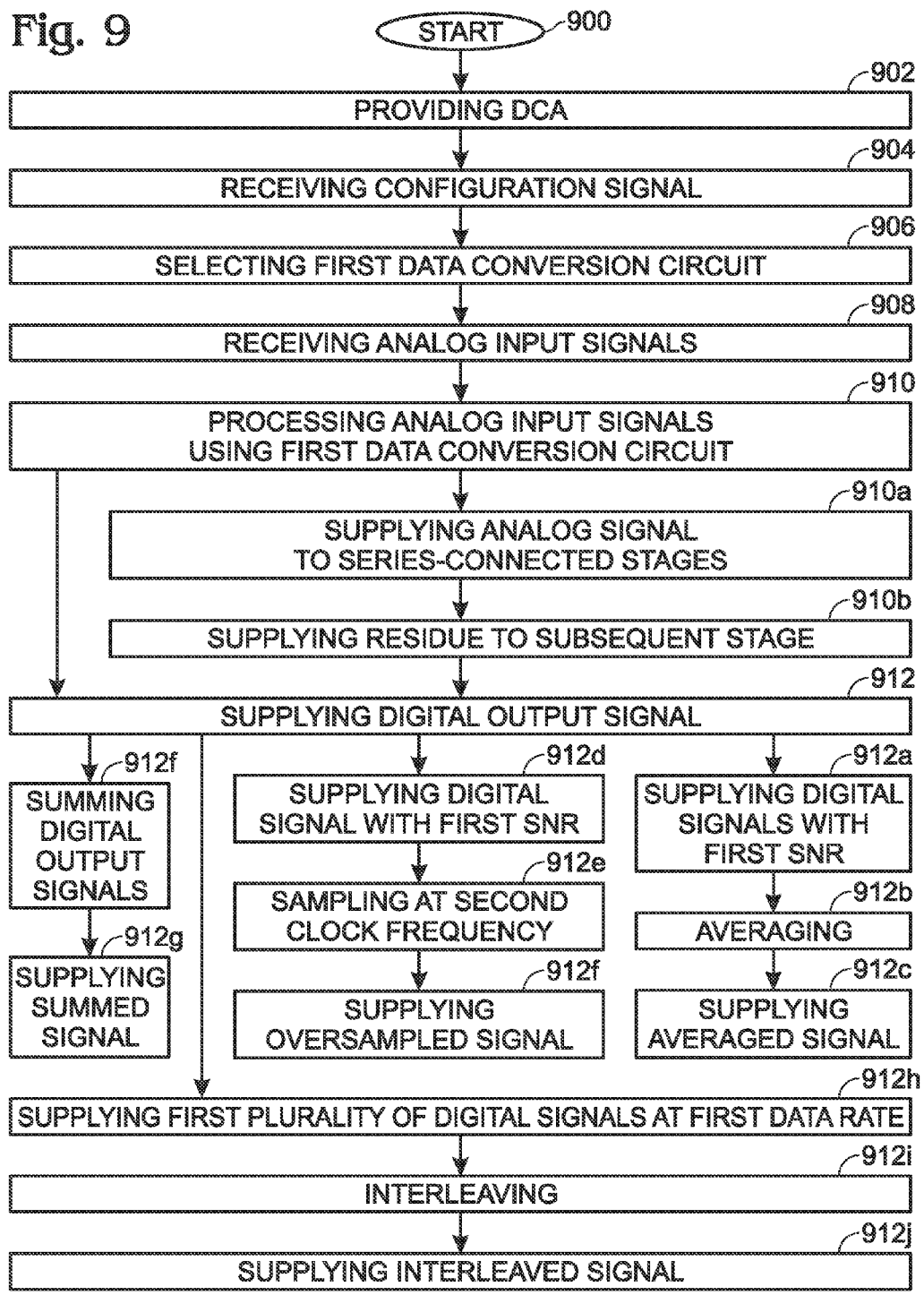

EXTERNALLY CONTROLLED DATA CONVERTER WITH CONFIGURABLE FUNCTIONS

RELATED APPLICATIONS

This application is a Continuation of an application entitled, DATA CONVERTER WITH CONFIGURABLE FUNCTIONS, invented by Michael Kappes, Ser. No. 14/050,434, filed Oct. 10, 2013, which is incorporated herein by reference.

BACKGROUND OF THE INVENTION

1. Field of the Invention

This invention generally relates to analog-to-digital converters (ADCs) and, more particularly, to a data converter module configured with a plurality of selectable ADC functions so as to provide the user with a choice of data rate, signal-to-noise ratio, and resolution options.

2. Description of the Related Art

As noted in Wikipedia, an ADC is a device that converts a continuous physical quantity, such as voltage, to a digital number that represents the analog quantity's amplitude. The conversion involves quantization of the input, so it necessarily introduces a small amount of error. Instead of doing a single conversion, an ADC often performs the conversions by sampling the input periodically. The result is a sequence of digital values that have converted a continuous-time and continuous-amplitude analog signal to a discrete-time and discrete-amplitude digital signal.

An ADC is often characterized by its input bandwidth, the range of input signal frequencies it can measure, and its signal-to-noise ratio (SNR). SNR is the accuracy with which a signal can be measured with respect to the noise it introduces. The SNR of an ADC is influenced by many factors, including the resolution, which is the number of output levels to which it can quantize a signal. Linearity and accuracy, or how well the quantization levels match the true analog signal, and aperture jitter, small timing errors that introduce additional errors, also influence the SNR. The SNR of an ADC is often summarized in terms of its effective number of bits (ENOB), the number of bits of each measure it returns that are on average not noise. ADCs are chosen to match the bandwidth and required SNR of the signal to be quantized.

Conventionally, if an ADC operates at a sampling rate greater than twice the bandwidth of the signal, then perfect reconstruction is possible given an ideal ADC and neglecting quantization error. The presence of quantization error limits the SNR of even an ideal ADC. However, if the SNR of the ADC exceeds that of the input signal, its effects may be neglected resulting in an essentially perfect digital representation of the input signal.

The resolution of the converter indicates the number of discrete values it can produce over the range of analog values. The resolution determines the magnitude of the quantization error and therefore determines the maximum possible average SNR for an ideal ADC without the use of oversampling. The values are usually stored electronically in binary form, so the resolution is usually expressed in bits. In consequence, the number of discrete values available, or "levels", is assumed to be a power of two. For example, an ADC with a resolution of 8 bits can encode an analog input to one in 256 different analog levels, since $2^8=256$. Resolution can also be defined electrically, and expressed in volts. The minimum change in voltage required to guarantee a change in the output code level digital signal is called the least significant bit (LSB) voltage.

The analog signal is continuous in time and it is necessary to convert this to a flow of digital values. Therefore, a rate must be determined at which new digital values are sampled from the analog signal. The rate of new values is called the sampling rate or sampling frequency of the converter. A continuously varying bandlimited signal can be sampled as the signal values at intervals of time T, the sampling time, are measured and stored. Then, the original signal can be exactly reproduced from the discrete-time values by an interpolation formula. The accuracy is limited by quantization error. However, this faithful reproduction is typically only possible if the sampling rate is higher than twice the highest frequency of the signal. This is essentially what is embodied in the Shannon-Nyquist sampling theorem.

An ADC works by sampling the value of the input at discrete intervals in time. Provided that the input is sampled above the Nyquist rate, defined as twice the highest frequency of interest, then all frequencies in the signal can be reconstructed. If frequencies above half the Nyquist rate are sampled, they are incorrectly detected as lower frequencies, a process referred to as aliasing. Aliasing occurs because instantaneously sampling a function at two or fewer times per cycle results in missed cycles, incorrectly giving the appearance of a lower frequency. To avoid aliasing, the input to an ADC may be low-pass filtered to remove frequencies above half the sampling rate. This filter is called an anti-aliasing filter.

Although aliasing in most systems is unwanted, in some aspects it may be exploited to provide simultaneous down-mixing of a band-limited high frequency signal. The alias is effectively the lower heterodyne of the signal frequency and sampling frequency.

Signals are often sampled at the minimum rate required, for economy, with the result that the quantization noise introduced is white noise spread over the whole pass band of the converter. If a signal is sampled at a rate much higher than the Nyquist frequency, and then digitally filtered to limit it to the signal bandwidth, there are many advantages. A digital filter can have better properties, such as a sharper rolloff, than an analog filter, so a sharper anti-aliasing filter can be realized. Subsequent to filtering, the signal can be downsampled. This technique creates an effectively larger resolution than can be provided by an ADC device acting alone.

These are many ways of implementing an electronic ADC. A direct-conversion ADC or flash ADC has a bank of comparators sampling the input signal in parallel, each firing for their decoded voltage range. The comparator bank feeds a logic circuit that generates a code for each voltage range. Direct conversion is very fast, capable of gigahertz sampling rates, but usually has only 8 bits of resolution or fewer, since the number of comparators needed, $2^N-1$, doubles with each additional bit, requiring a large, expensive circuit. ADCs of this type typically have a large die size, a high input capacitance, high power dissipation, and are prone to produce glitches at the output (by outputting an out-of-sequence code). U.S. Pat. No. 8,519,876, invented by Zhi-Ming Lin, filed on Mar. 27, 2012, is incorporated herein by reference, and provides an example of a flash ADC.

A successive-approximation ADC uses a comparator to successively narrow a range that contains the input voltage. At each successive step, the converter compares the input voltage to the output of an internal digital to analog converter which might represent the midpoint of a selected voltage range. At each step in this process, the approximation is stored in a successive approximation register (SAR). U.S. Pat. No. 8,542,144, invented by A. Coban, filed on Sep. 30, 2011, is incorporated herein by reference, and provides an example of a successive-approximation ADC.

A ramp-compare ADC produces a saw-tooth signal that ramps up or down then quickly returns to zero. When the ramp starts, a timer starts counting. When the ramp voltage matches the input, a comparator fires, and the timer's value is recorded. Timed ramp converters require the least number of transistors. The ramp time is sensitive to temperature because it is dependent upon the circuit generating the ramp.

The Wilkinson ADC is based on the comparison of an input voltage with that produced by a charging capacitor. The capacitor is allowed to charge until its voltage is equal to the amplitude of the input pulse. A comparator determines when this condition has been reached. Then, the capacitor is allowed to discharge linearly, which produces a ramp voltage. At the point when the capacitor begins to discharge, a gate pulse is initiated. The gate pulse remains on until the capacitor is completely discharged. Thus, the duration of the gate pulse is directly proportional to the amplitude of the input pulse. This gate pulse operates a linear gate which receives pulses from a high-frequency oscillator clock. While the gate is open, a discrete number of clock pulses pass through the linear gate and are counted by the address register. The time the linear gate is open is proportional to the amplitude of the input pulse, thus the number of clock pulses recorded in the address register is proportional to the amplitude. Alternatively, the charging of the capacitor can be monitored, rather than the discharge.

An integrating ADC, also known as a dual-slope or multi-slope ADC, applies an unknown input voltage to the input of an integrator and allows the voltage to ramp for a fixed time period (the run-up period). Then a known reference voltage of opposite polarity is applied to the integrator, and is allowed to ramp until the integrator output returns to zero (the run-down period). The input voltage is computed as a function of the reference voltage, the constant run-up time period, and the measured run-down time period. The run-down time measurement is usually made in units of the converter's clock, so longer integration times allow for higher resolutions. The speed of the converter can be improved by sacrificing resolution.

A delta-encoded (tracking) ADC or counter-ramp has an up-down counter that feeds a digital-to-analog converter (DAC). The input signal and the DAC both go to a comparator. The comparator controls the counter. The circuit uses negative feedback from the comparator to adjust the counter until the DAC's output is close enough to the input signal. The number is read from the counter. Delta converters have very wide ranges and high resolution, but the conversion time is dependent on the input signal level. Some converters combine the delta and successive approximation approaches; this works especially well when high frequencies are small in magnitude. U.S. Pat. No. 8,358,231, invented by Killat et al., with a priority date of Feb. 21, 2011, which is incorporated herein by reference, provides an example of a delta-encoded ADC.

FIG. 1 is a schematic drawing depicting a multi-stage pipelined ADC (prior art). As noted in U.S. Pat. No. 8,368,571, invented by Eric Siragusa, filed on Mar. 31, 2011, and incorporated herein by reference, a typical pipelined ADC 20, configured to convert an analog input signal AIN to a digital output signal DOUT, includes a plurality of pipeline stages 24, each stage 24 receiving an individual analog input signal AI and generating an individual digital output signal DO, an analog output signal AO, an analog residue signal AR, and an amplified analog residue signal AAR, which is converted to a corresponding digitized residue DR. Each stage can include an ADC subcircuit 28 to generate the digital output DO, a DAC 32 to generate the analog output AO, and a summation circuit 36 and amplifier circuit 40 to generate the analog residue AR and amplified analog residue AAR. The digital output DO of each stage 24 represents a digitalization, at a predetermined bit width, of the analog input AI received by that stage 24. The analog output AO represents a conversion of the digital output DO of that stage 24 back into analog form. The analog residue AR is a subtraction of the analog output AO from the analog input AI of that state 24, and represents the unconverted remainder of the analog input AI received by the stage 24. The digitized residue DR returned to a given stage 24 represents a digitalization of the analog residue AR by succeeding stages 24.

In operation, the pipelined ADC 20 converts the overall analog input AIN delivered to the first stage 24 by successively approximating in turn the analog input AI at each stage 24, to the predetermined bit width of that stage 24, then generating and amplifying the analog residue AR representing the unconverted remainder of the analog input AI at that stage 24, and passing the amplified residue MR to the next stage 24 and repeating the process. Ultimately, the ADC 20 can convert the original analog input AIN by combining the digital output DO produced by each of the individual stages 24, which can be performed by a delay and combine circuit 44, to successively build corresponding digitized residues DR into the overall digital output DOUT. Other architectures are known in the art that can be configured to improve resolution.

An oversampling ADC, oversamples an analog input signal by a large factor and filters the desired signal band. In a sigma-delta version of this ADC, the resulting signal, along with the error generated by the discrete levels of a flash ADC, is fed back and subtracted from the input to the aliasing filter. This negative feedback has the effect of noise shaping the error due to the flash, so that it does not appear in the desired signal frequencies. A digital filter (decimation filter) follows the ADC that reduces the sampling rate, filters off unwanted noise, and increases the resolution of the output. The use of "noise-shaping" through analog feedback mechanisms is not required to benefit from oversampling, but noise shaping makes oversampling more efficient (more resolution with less oversampling). However, this process requires approximately greater than 16× oversampling to be effective, as well as analog filter and feedback mechanisms. Simple decimation filtering of a flat (white) noise data converter yields an effective 3 dB SNR for every octave of oversampling. US 2010/0283649, invented by Bos et al., with a priority date of May 7, 2010, is incorporated herein by reference, and provides an example of a sigma-delta ADC.

A time-interleaved ADC uses M parallel ADCs where each ADC samples data every M:th cycle of the effective sample clock. The result is that the sample rate is increased M times compared to what each individual ADC can manage. Technologies exist to correct time-interleaving mismatch errors. An ADC with an intermediate frequency modulation (FM) stage first uses a voltage-to-frequency converter to convert the desired signal into an oscillating signal with a frequency proportional to the voltage of the desired signal, and then uses a frequency counter to convert that frequency into a digital count proportional to the desired signal voltage. U.S. Pat. No. 8,542,142, invented by Stein et al., filed on Feb. 21, 2013, is incorporated herein by reference, and provides an example of an interleaved ADC.

A time-stretch analog-to-digital converter (TS-ADC) digitizes a very wide bandwidth analog signal, which cannot be digitized by a conventional electronic ADC, by time-stretching the signal prior to digitization. This technique effectively slows the signal down in time and compresses its bandwidth. As a result, an electronic backend ADC that would have been too slow to capture the original signal, can now capture this slowed down signal.

Other types of ADCs, and variations of the above-mentioned ADC type include the following. U.S. Pat. No. 8,542,140, invented by Chen et al., filed on Jan. 12, 2012, is incorporated herein by reference, and provides an example of an exponential-logarithmic ADC. U.S. Pat. No. 8,471,751, invented by Zhenning Wang, filed on Jun. 30, 2011, is incorporated herein by reference, and provides an example of a time-to-digital converter (TDC).

FIG. 2 is a schematic diagram of a conventional ADC system with multiplexed inputs and outputs (prior art). Conventionally, in designing a product, the manufacturer of an electrical system determines the performance required by an ADC, specifying characteristics such the data rate, digital output signal resolution, and SNR. Upon determining the ADC performance required, an ADC is designed from discrete components, or an ADC integrated circuit (IC) is purchased from a vendor. In the case of the IC, the printed circuit board (PCB) upon which the ADC is mounted must be designed to conform to a pre-existing IC pin out, or a custom IC designed with a pin out that conforms to the PCB. Advantageously, the ADC system of FIG. 2 uses an input multiplexer (MUX) 200 so that the input to the ADC 202 can be connected to any of the inputs A through n. Likewise, output MUX 204 permits the digital output signals to be connected to outputs A' through n'. These interfaces permit the ADC system to be used in different PCBs by simply controlling the MUXs. A similar result can be obtained if the IC vendor replaces the MUXs with arrays of input and outputs pins, with customer-selected inputs and outputs that can be selectively wire bonded to ADC circuitry during fabrication.

However, a problem still exists for the manufacturer, in that they must still design their overall system around the electrical performance characteristics of pre-existing ADCs, or have a custom made ADC designed and built to fit the needs of their system. Unfortunately, this decision must be made for each system design. This problem necessarily impacts overall product performance and options, as well as ADC component lead times and costs.

U.S. Pat. No. 8,519,878, invented by Jensen et al., filed Jun. 27, 2011, describes ADC circuitry that can be adjusted to function at a variety of input frequency bands. However, this device cannot modify the type of ADC functions being performed. U.S. Pat. No. 8,462,030, invented by Khurram Muhammad, filed Apr. 27, 2004, describes a successive-approximation ADC with a programmable loop filter that can be configured to improve SNR. However, this device does not permit a user to select between different types of ADC circuits. U.S. Pat. No. 8,335,484, invented by Arad et al., filed Jul. 31, 2006, describes an ADC circuits able to make adjustments to compensate for an input signal with a large dynamic range. However, this device cannot modify the type of ADC functions being performed.

It would be advantageous if a configurable ADC existed that permitted the user to select between multiple levels and/or types of data conversion performance characteristics.

SUMMARY OF THE INVENTION

Accordingly, a data converter module is provided with an analog interface to receive analog signals, a digital interface to transmit digital signals, and a configuration interface to accept configuration signals. The data conversion module also includes a data conversion array (DCA) with a plurality of selectively engageable data conversion circuits for the conversion of analog input signals to digital output signals. The data conversion circuits are responsive to the configuration signals. The DCA's selectively engageable data conversion circuits may be selected from different types of configurable data resolution circuits and configurable data conversion speed circuits. For example, the configurable data resolution circuits may be averaging, oversampling, and multi-stage pipelining circuits. Further, the data resolution circuits selected may also include selectable features that permit a particular circuit to be modified to suit the needs of the user. A DCA configurable data speed circuit may be selected that interleaves the outputs from multiple parallelly connected ADCs operating at different clock phases. In one aspect, the number of clock phases is selectable.

Also provided is a method for configurable data conversion. The method provides a DCA with a plurality of selectively engageable data conversion circuits for the conversion of analog input signals to digital output signals. In response to receiving a configuration signal, the DCA selects a first data conversion circuit. The DCA then receives analog input signals, and processes the analog input signals using the first data conversion circuit. As a result, the DCA supplies digital output signals. Examples of selectively engageable data conversion circuits have been mentioned above.

Also provided is a method for dynamically configuring data conversion. The method provides a DCA with a plurality of selectively engageable data conversion circuits for conversion from analog input signals to digital output signals. The DCA converts analog input signals to digital output signals using a first data conversion circuit. In response to a configuration signal, the DCA converts analog input signals to digital output signals using a second data conversion circuit.

Additional details of the above-described data conversion module and configurable data conversion methods are provided below.

BRIEF DESCRIPTION OF THE DRAWINGS

FIGS. 3A through 3F are schematic block diagrams of a data converter module.

FIGS. 4A and 4B are schematic block diagrams of a DCA averaging circuit.

FIGS. 6A and 6B are schematic block diagrams of a DCA multi-stage pipelining circuit.

FIGS. 7A and 7B are schematic block diagrams of a DCA data speed circuit.

FIG. 8 is a flowchart illustrating a method for dynamically configuring data conversion.

FIG. 9 is a flowchart illustrating another method for configurable data conversion.

DETAILED DESCRIPTION

FIGS. 3A through 3F are schematic block diagrams of a data converter module. The data converter module 300 comprises an analog interface 302 to receive analog input signals on line 304, a digital interface 306 to transmit digital output signals on line 308, and a configuration interface 310 to accept configuration signals on line 312. A data conversion array (DCA) 314 comprises a plurality of selectively engageable data conversion circuits 316-0 through 316-n for the conversion of analog input signals to digital output signals, where n is an integer greater one and not limited to any particular value. The data conversion circuits 316-0 through 316-n are responsive to the configuration signals on line 312, as explained in detail below.

As shown in FIG. 3A, in one aspect a particular data conversion circuit (or circuits), for example 316-0, is selected for use in response to the configuration signals on line 312. Here, the selection of particular data conversion circuits is enabled through the use of an input multiplexer (MUX) 318 and an output MUX (or demultiplexer) 320. However, other means of making selectable connections are known in the art, and the module 300 is not limited to any particular switching mechanism.

In FIG. 3B, the DCA 304 only includes one particular type of DCC. However, selectable features and subcomponents of DCC enable it to perform as one of a plurality of selectively engageable data conversion circuits (e.g., 316: 0 through n), as controlled by the configuration signals on line 312. Details of DCCs with selectively controllable features are presented in detail below.

In FIG. 3C, the configuration signals on line 312 are being used to control MUXs 318 and 320, and to address particular data conversion circuit (DCC) 316-0 through 316-n via line 322. As in the description of FIG. 3B, one or more of the DCCs may have selectable features and subcomponents that enable it to perform as one of a plurality of selectively engageable data conversion circuits.

Figure 3D:
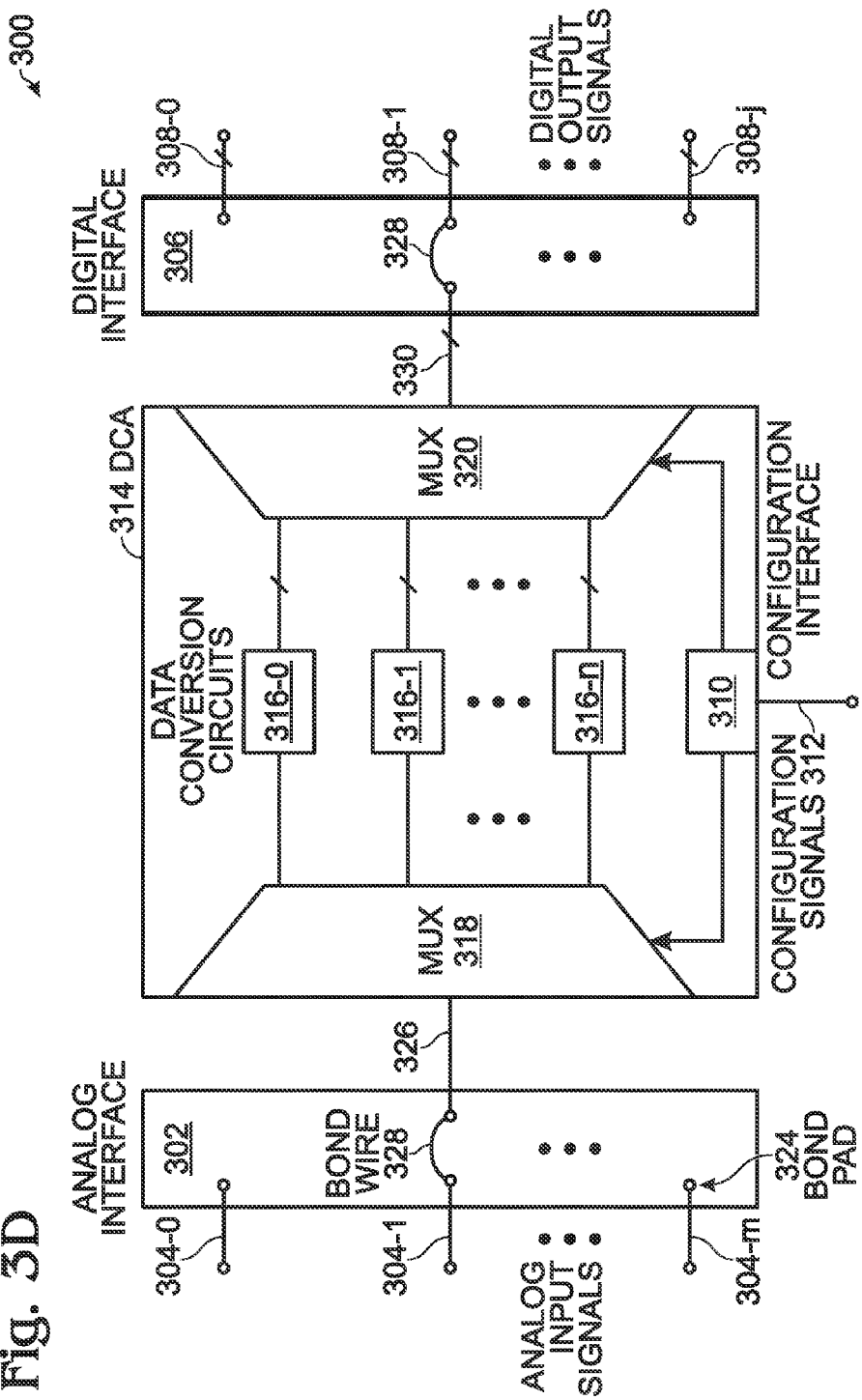

In FIG. 3D the analog interface 302 and digital interface 306 are enabled using a set of parallel bond pads 324 that enable the input to MUX 318 on line 326 to be wire bonded to one of the analog input signal lines 304-0 through 304-m, where m is an integer greater than one and not limited to any particular value. In this example, a wire bond 328 is shown connecting line 304-1 to line 326. The digital interface 306 is configured in a similar manner, with multiple digital output signal lines 308-0 through 308-j. In this example, a wire bond 328 is connected digital output signal line 308-1 to the output of MUX 320 on line 330. Note, although a bond pad analog interface 302 and bond pad digital interface 306 are only shown with the data converter module 300 of FIG. 3D, bond pad interfaces can likewise be used with the data converter modules of FIGS. 3B and 3C. Further, in some aspects of FIG. 3D only one of the analog or digital interfaces is enabled with bond pads, with the other interface being enabled as a single pin as depicted in FIG. 3A.

In FIG. 3E the analog interface 302 and digital interface 306 are enabled using, respectively, MUXs 332 and 334. MUXs 332 and 334 are controlled in response to control signals on line 322. However, other means of making selectable connections are known in the art, and the analog and digital interfaces 302 and 306 are not limited to any particular switching mechanism. In some aspects only one of the analog interface or digital interface is enabled with a MUX, with the other interface being enabled as a single pin as depicted in FIG. 3A, or as a set of parallel bond pads, as depicted in FIG. 3D.

In FIG. 3F crossbar switch 336 is used to connect analog input signals on lines 304-0 through 304-m to the inputs of DCCs 316-0 through 316-n. Likewise, crossbar switch 338 is used to connect the outputs of DCCs 316-0 through 316-n to digital output signal lines 308-0 through 308-j, where j is an integer greater than one and not limited to any particular value. The crossbar connections are controlled via control signals on line 322 from the configuration interface 310, which is responsive to the configuration signals on line 312. In one aspect not shown, the configuration signals on line 312 are also used to address particular DCCs 316-0 through 316-n, as shown in FIGS. 3B and 3C, as one or more of the DCCs may have selectable features and subcomponents that enable it to perform as one of a plurality of selectively engageable data conversion circuits. In some aspects only the analog or digital interface is enabled with a crossbar switch, with the other interface being enabled as a single pin as depicted in FIG. 3A, a set of parallel bond pads as depicted in FIG. 3D, or a MUX as depicted in FIG. 3E.

The DCA selectively engageable data conversion circuits 316-0 through 316-n may be a single configurable data resolution circuit with selectively enabled features, or a single configurable data conversion speed circuit with selectively enabled features (e.g., FIG. 3B). The selected enabled features of particular data resolution and data speed circuits are presented in detail below. Alternatively, the DCA may be comprised of a plurality of configurable data resolution circuits (e.g. FIG. 3A) which may optionally have selectively enabled features (e.g. FIG. 3C), or plurality a configurable data conversion speed circuits, which may optionally have selectively enabled features. Further, the DCA 304 may comprise both configurable data resolution circuits and configurable data conversion speed circuits, which may optionally have selectively enabled features (e.g. FIG. 3C). The DCA 304 configurable data resolution circuits are selected from averaging, oversampling, or multi-stage pipelining circuits. However, the DCA is not limited to particular types of data resolution circuits, and other types of data resolution circuits may be used in the DCA.

Figure 4B:
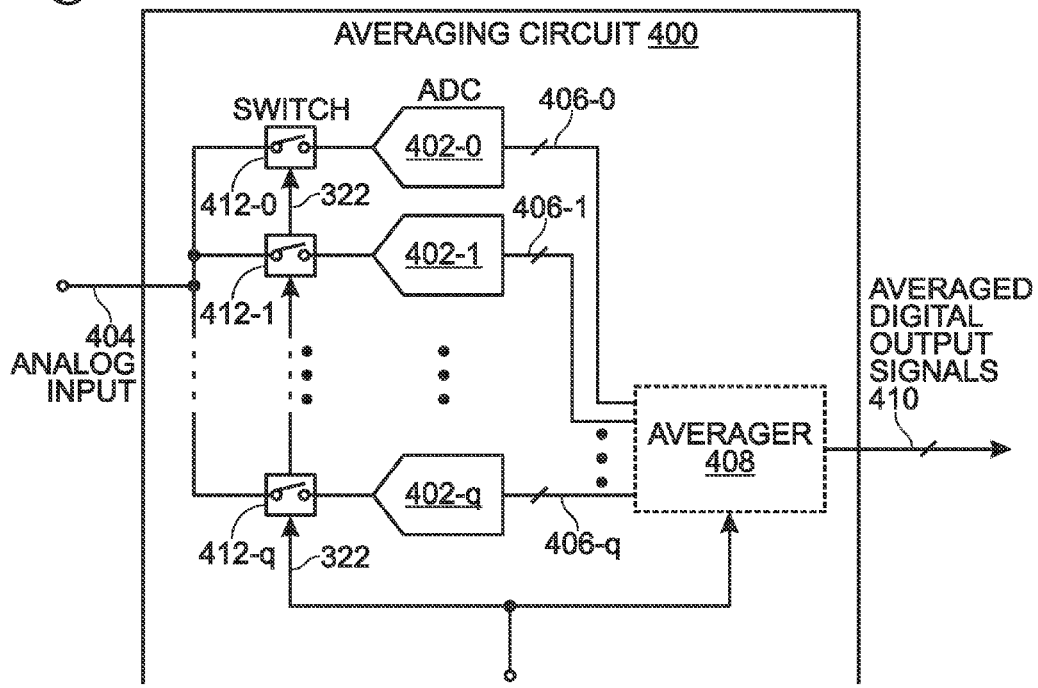

FIGS. 4A and 4B are schematic block diagrams of a DCA averaging circuit. The averaging circuit 400 comprises a plurality of analog-to-digital converters (ADCs) 402-0 through 402-q, where q is an integer greater than one and not limited to any particular value. Each ADC 402-0 through 402-q has an analog input on line 404 to accept an analog input signal and a digital output to respectively supply a digital output signal on lines 406-0 through 406-q with a first signal-to-noise ratio (SNR) in response to sampling the analog input signal. Examples of ADCs that can be used for this purpose have been provided in the Background Section, above. These ADCs, and other unmentioned ADCs known in the art, may be used to enable the circuits described herein.

An averager 408 has a plurality of inputs on lines 406-0 through 406-q. Each input is connected to a corresponding ADC digital output. The averager 408 has an output on line 410 to supply an averaged digital output signal with a second SNR, greater than the first SNR. The averager 408 is a digital device that uses techniques that are well known in the art. The averager circuit 408 is not limited to any particular averaging algorithm.

The averager 408 can be enabled as a state machine using combinational logic components (not explicitly shown). Alternatively, but not explicitly shown, the averager 408 can be enabled using a field programmable gate array (FPGA), or a processor in cooperation with a sequence to processor executable instructions stored in a non-transitory memory. The non-transitory memory may also be referred to as a computer-readable medium, which is any medium that participates in providing instructions to a processor for execution. Such a medium may take many forms, including but not limited to, non-volatile media, volatile media, and transmission media. Non-volatile media includes, for example, optical or magnetic disks. Volatile media includes dynamic memory. Common forms of computer-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge.

A number of averaging algorithms are known in the art. Generally, the averaging of multiple discrete digital signals in the digital domain reduces the noise power, enhancing the signal-to-noise ratio and, hence, resolution. Averaging through simple addition and division (e.g. averaging 4 channels (A, B, C, D) results in the output Y=(A+B+C+D)/4), improves the signal-to-noise ratio by 3 dB for every doubling of channels (e.g., 2 channels yields 3 dB, 4 channels yields 6 dB).

The averager 408 is shown with phantom lines to represent that it may be located in the averaging circuit 400, the DCA, or off the data conversion module, but in communication with the DCA (e.g., via the configuration interface for example). Alternatively, portions of the averager 408 may be divided between the averaging circuit 400, the DCA, and off the data conversion module. In one aspect, as shown in FIG. 4A, the averaging circuit 400 is enabled using a fixed number (e.g., a value equal to q) of ADCs. In another aspect, as shown in FIG. 4B, the number of ADCs engaged by the averaging circuit 408 is selectable in response to signals received on line 322 from the configuration interface. The selectable number of ADCs is one example of a DCC having selectively enabled features, as mentioned above in the discussions of FIGS. 3B and 3C. As shown, the ADCs are enabled using switches 412-0 through 412-$q$. However, the averaging circuit 400 is not limited to any particular means selectively connecting ADCs. Although not explicitly shown, in some aspects a clock may be used to determine the rate at which the averager samples the ADC outputs, depending upon the type of ADC being used.

Figure 5:
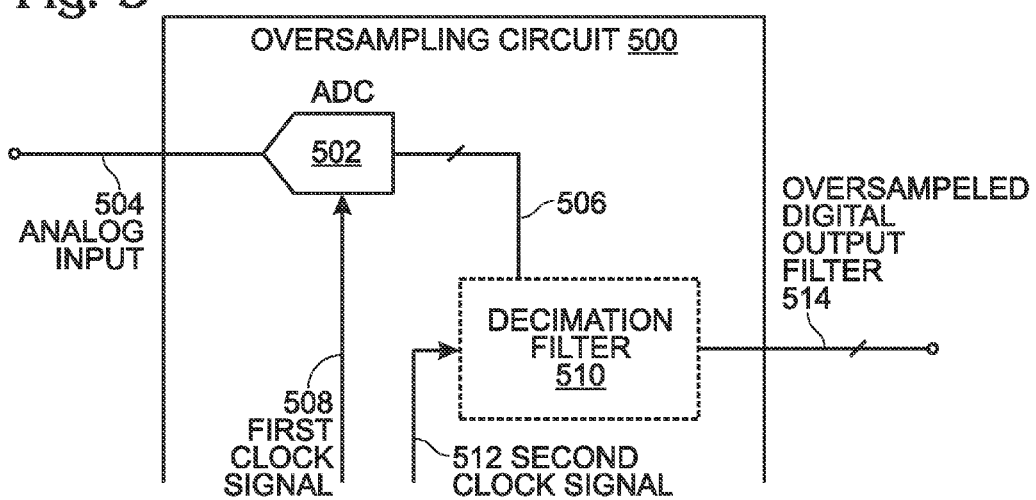
FIG. 5 is a schematic block diagram depicting a DCA oversampling circuit.

FIG. 5 is a schematic block diagram depicting a DCA oversampling circuit. The oversampling circuit 500 comprises an ADC 502 having an analog input on line 504 to accept an analog input signal having a first signal frequency. The ADC 502 has a digital output on line 506 to supply a digital output signal having a first SNR. The ADC may be any one of the ADC types described above in the Background Section. Further, the ADC 502 has a clock input on line 508 for accepting a first clock signal having a first clock frequency greater than the first signal frequency. The analog signal on line 504 is sampled at the first clock frequency. Typically, the first clock frequency is greater than the Nyquist rate associated with the analog input signal. A digital decimation filter 510 has an input on line 506 to accept the ADC digital output signal, and a clock input on line 512 for accepting a second clock signal having a second clock frequency, greater than or equal to the first signal frequency. Typically, the second clock frequency is equal to the Nyquist rate associated with the analog input signal. The digital decimation filter 510 has a digital output on line 514 to supply an oversampled digital output signal having a second SNR, greater than the first SNR.

With oversampling, the ADC 502 is used at a higher sample rate (first clock) than the final output data rate (second clock). The oversampled digital output signal on line 514 is effectively sampled multiple times by the same ADC. Averaging the multiple outputs for each data rate update results in an improvement in SNR by virtue of a reduction in the noise of the system. This process has the same benefits as the averaging circuit discussed above, in that every doubling of the sample rate (e.g. averaging of 2 samples) results in a 3 dB improvement in the SNR. The oversampling technique also requires downsampling with the second clock to get to the original target data rate (first signal frequency), and is known as decimation.

The digital decimation filter 510 can be enabled as a state machine using combinational logic components (not explicitly shown). Alternatively, but not explicitly shown, the digital decimation filter 510 can be enabled using a FPGA, or a processor in cooperation with a sequence to processor executable instructions stored in a non-transitory memory. A number of decimation filtering techniques are known in the art. The digital decimation filter 510 is shown with phantom lines to represent that it may be located in the oversampling circuit 500, in the DCA, or off the data conversion module, but in communication with the DCA (e.g., via the configuration interface for example). Alternatively, portions of the digital decimation filter 510 may be divided between the oversampling circuit 500, the DCA, and off the data conversion module. In one aspect, the ADC 502 accepts a first clock signal on line 508 having a selectable first clock frequency, and the digital decimation filter 510 accepts a second clock on line 512 having a selectable second clock frequency. The ability to select first and second clock frequencies is one example of a DCC having selectively enabled features, as mentioned above in the descriptions of FIGS. 3B and 3C. The clock or clocks (not shown) providing the first and second clock signals may be located in the oversampling circuit, elsewhere in the DCA, or located off the data conversion module. If located in the data conversion module, the first and second clocks may receive control signals from the configuration module (e.g., configuration module 310 sending control signals on line 322, see FIG. 3C).

Figure 1:
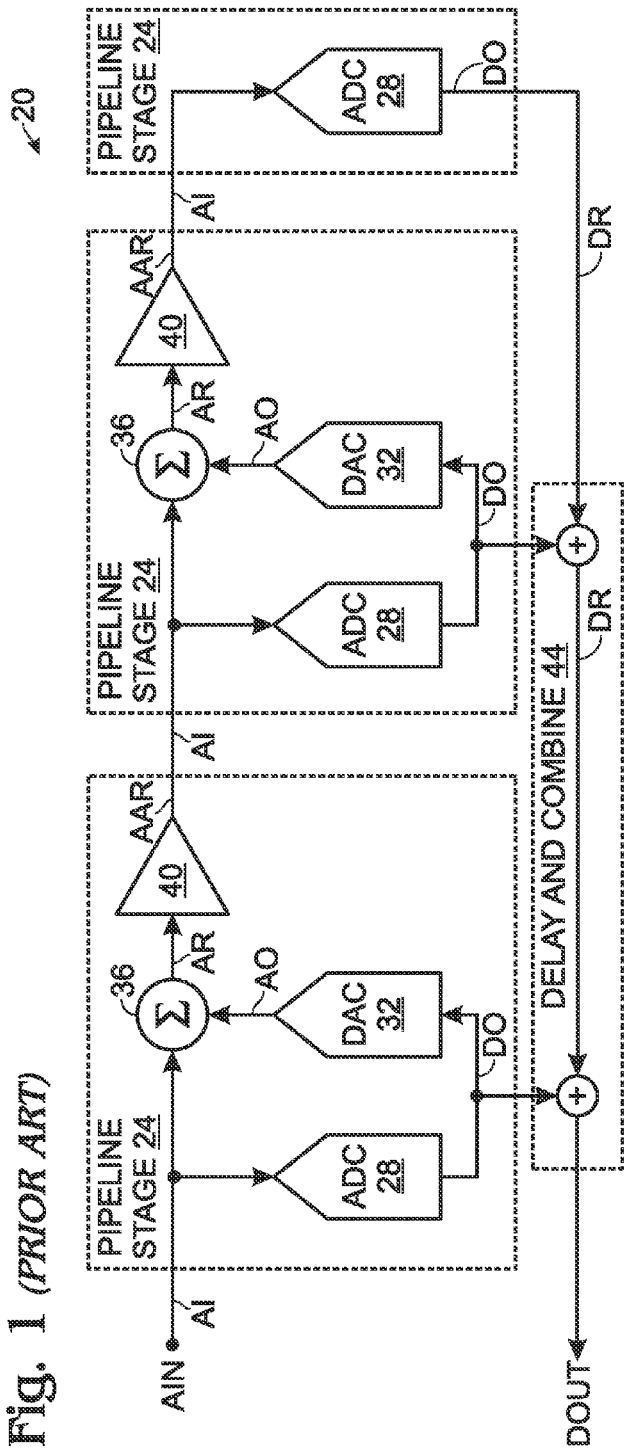
FIG. 1 is a schematic drawing depicting a multi-stage pipelined ADC (prior art).
Figure 2:
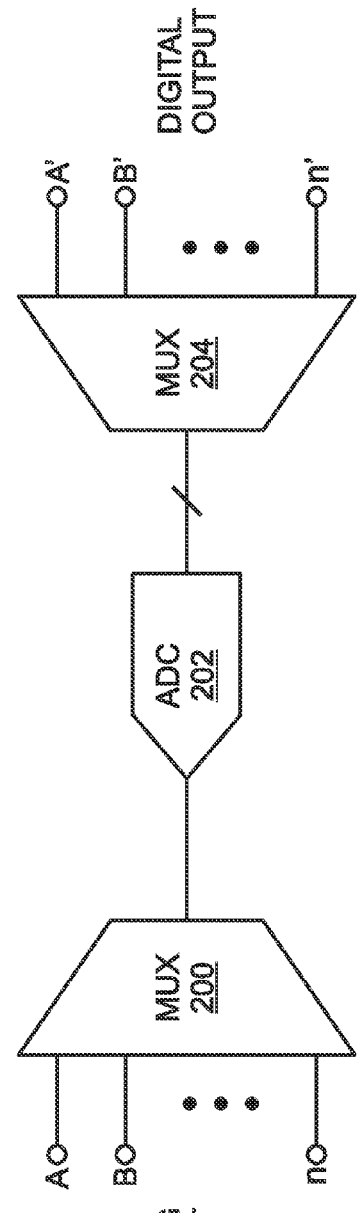
FIG. 2 is a schematic diagram of a conventional ADC system with multiplexed inputs and outputs (prior art).
Figure 6A:
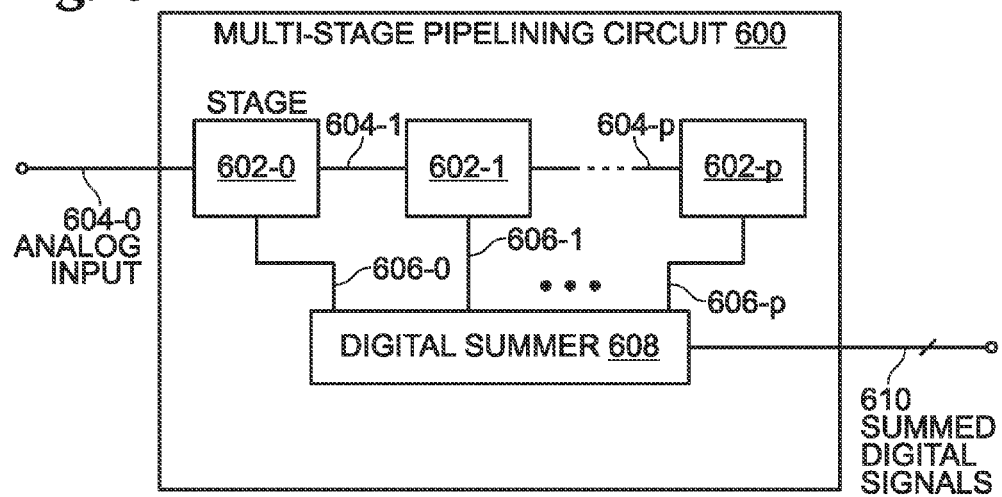

FIGS. 6A and 6B are schematic block diagrams of a DCA multi-stage pipelining circuit. The multi-stage pipelining circuit 600 comprises a plurality of stages 602-0 through 602-$p$ connected in series, where p is an integer greater than one and not limited to any particular value. Each stage 602 respectively accepts an analog input signal on lines 604-0 through 604-$p$, and respectively supplies a digital output signal on lines 606-0 through 606-$p$ in response to sampling the analog signal. Each non-final stage (i.e., all stages except 602-$p$) supplies an amplified analog residue signal, respectively on lines 604-0 through 604-($p$-1) to a subsequently connected stage in response to comparing a quantized version of the analog input signal to the analog input signal. Thus, the multi-stage pipelining circuit 600 is comprised of successive stages of coarse data converters and signal processing units which serve to quantize the signal and pass an amplified residue to the next stage. One example of such a stage has been described in the Background Section and depicted in FIG. 1. However, it should be understood that a variety of pipelining techniques are known in the art, and that stages based upon these other known technologies may also be employed in the multi-stage pipelining circuit 600. The ADCs used may be any one of the ADC types described above in the Background Section.

A digital summer 608 accepts the digital output signal of each stage on lines 606-0 through 606-$p$, and supplies a summed digital signal on line 610. The resolution of the summed digital signal on line 610 is responsive to the number of successively connected stages 602. The digital summer 608 can be enabled as a state machine using combinational logic components (not explicitly shown). Alternatively, but not explicitly shown, the digital summer 608 can be enabled using a FPGA, or a processor in cooperation with a sequence of processor executable instructions stored in a non-transitory memory. The digital summer 608 is shown with phantom lines to represent that it may be located in the multi-stage pipelining circuit 600, in the DCA, or off the data conversion module, but in communication with the DCA (e.g., via the configuration interface for example). Alternatively, portions of the digital summer 608 may be divided between the multi-stage pipelining circuit 600, the DCA, and off the data conversion module. Although not explicitly shown, a clock may be used to determine the rate at which the stages sample the analog input signals.

In FIG. 6A a fixed number of stages are used, where the number of stages is equal to the value of p. In FIG. 6B the multi-stage pipelining circuit 600 comprises a selectively connectable plurality of stages. Here, demultiplexers (DE-MUX) 612, and DEMUXs 614-0 through 614-(p–1) are used to control the number of stages in sequence, and to some degree the order of stages. This arrangement of stages permits a number of options. For example, stage 602-0 may be able to discern analog differences with a higher resolution, at the expenses of greater power consumption, and it may be bypassed in some applications. This multi-stage pipelining circuit can thus support variable resolution flexibility by enabling or bypassing stages to achieve higher or lower resolution. The demultiplexers are controlled by a control signal on line 322 originating from the configuration interface. Although a network of demultiplexers has been shown to enable connectivity between stages, other means of selectively connection are known in the art that could be used to enable the multi-stage pipelining circuit 600. Note: more complex systems of switches or demultiplexers (not shown) could be used by one with skill in the art to enable a greater number of stage bypassing and ordering options. The ability to select stages in the pipeline is one example of a DCC having selectively enabled features, as mentioned above in the description of FIGS. 3B and 3C.

Figure 7A:
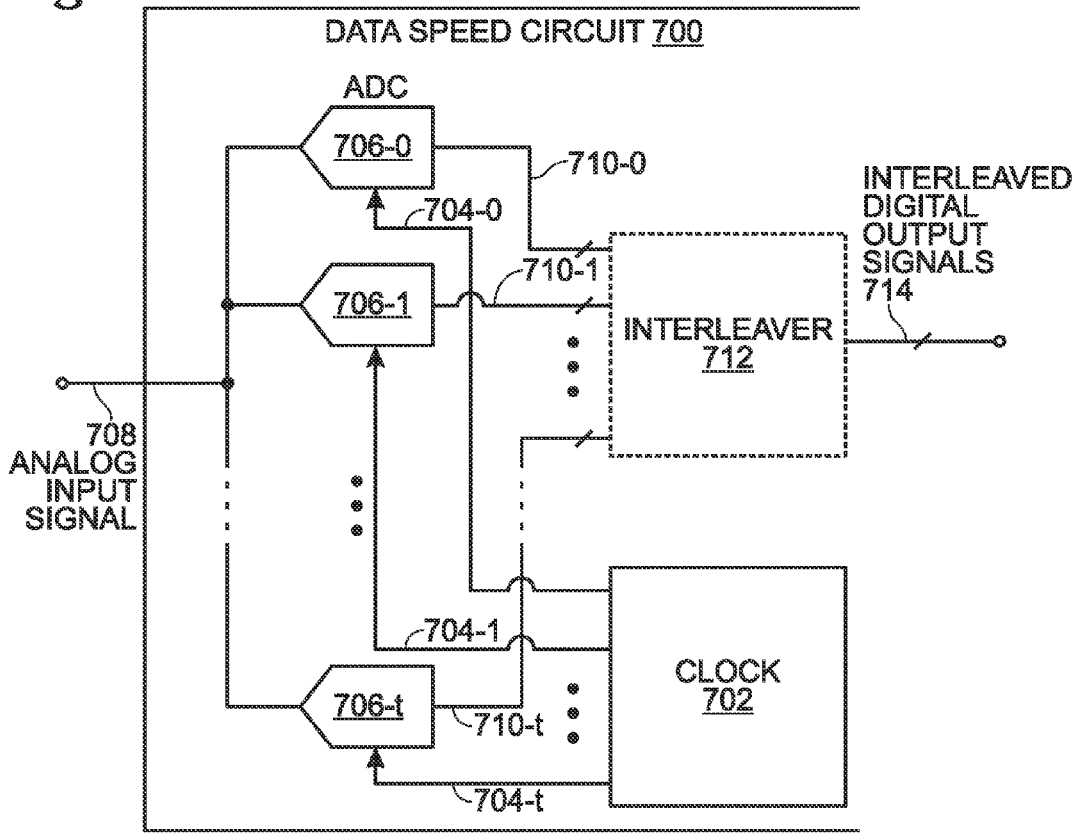

FIGS. 7A and 7B are schematic block diagrams of a DCA data speed circuit. The data speed circuit 700 comprises a clock 702 having a first plurality of clock outputs 704-0 through 704-t to supply a first clock signal at a first frequency with a first plurality of clock phases, where t is an integer greater than one and not limited to any particular value. Each clock output 704-0 through 704-t is associated with a unique clock phase. Alternatively but not shown, the clock may be located elsewhere in the DCA or off the data conversion module, but in communication with the data speed circuit. The data speed circuit 700 further comprises a first plurality of ADCs 706-0 through 706-t. Each ADC 706-0 through 706t has an input on line 708 to accept an analog input signal, and a respective clock input on lines 704-0 through 704-t to accept a corresponding first clock signal clock phase. Each ADC 706-0 through 706-t has a respective output on lines 710-0 through 710-t to supply a digital output signal at a first data rate in response to sampling the analog input signal at the first frequency.

An interleaver 712 has inputs connected to the first plurality of ADC digital outputs on lines 710-0 through 710-t, and an output on line 714 to supply an interleaved digital output signal having a second data rate, greater than the first data rate. The effective sample rate of the DCA can be enhanced in response to the number of ADCs used, times the rate of each ADC, through the technique of interleaving. Interleaving is the use of multiple ADCs sampling the same analog input signal, but with different clock phases, such that when recombined at the output, the overall sample rate is increased by the number of ADCs used.

The interleaver 712 can be enabled as a state machine using combinational logic components (not explicitly shown). Alternatively, but not explicitly shown, the interleaver 712 can be enabled using a FPGA, or a processor in cooperation with a sequence to processor executable instructions stored in a non-transitory memory. The interleaver 712 is shown with phantom lines to represent that it may be located in the data speed circuit 700, in the DCA, or off the data conversion module, but in communication with the DCA (e.g., via the configuration interface for example). Alternatively, portions of the interleaver 712 may be divided between the data speed circuit 700, the DCA, and off the data conversion module.

In FIG. 7A, the number of ADCs and clock phases is a fixed number equal to the value of t. In FIG. 7B, the ADCs in first plurality of ADCs are selectively engageable. In this example, the selectively is enabled using a set of switches 716-0 through 716-t managed by control signals on line 322. However, other means of selective connectivity are known in the art that would be applicable. Likewise, the clock 702 has a phase selection input on line 322 for selecting the number of phases in the first plurality of clock phases equal to the number of selected ADCs. The ability to select the number ADCs is one example of a DCC having selectively enabled features, as mentioned above in the description of FIGS. 3B and 3C.

While some of the data resolution and data speed circuits described herein are known in the art, their use in an array as a selectable component is both unknown and contrary to industry norms. Conventionally, the trend has been to smaller die sizes and specific performance characteristics narrowly designed for use in systems having unique requirements. However, by providing a single module with an array of configurable data conversion circuits, especially data conversion circuitry with selectable features, a myriad of performance options become available that can be configured to meet practically any system requirement. For example, the need for data converters in telecommunications equipment increases over time, and the systems described herein help future-proof a device to accommodate future increases in performance, and/or adaptations that may be needed, switching a long term evolution (LTE) receiver to a global positioning satellite (GPS) receiver for instance.

Further, the selection of particular data conversion circuits, with the selection of particular features for that data conversion circuit, permits the data conversion process to be modified and tuned as overall system requirement evolve or change. For example, based upon an improved SNR, a user may initiate configuration signals that cause a currently engaged averaging circuit to be operated with 4 ADCs instead of 6, while still meeting the system requirements, thus saving power. Alternatively, a user may initiate configuration signals that may cause the DCA to switch from a currently engaged averaging circuit to an oversampling circuit in order to improve resolution for a particular type of communication protocol being received. In one aspect, the modifications to DCA circuitry can be made by the data conversion module, or associated off-module device, based upon analysis of received signals and measurements such as bit error rate (BER) or ENOB. In another aspect, the data converter can be used to measure "coarse", then "fine" modes. For low battery consumption, for instance, the coarse mode is used to monitor for large signals, while the fine mode is used, when active, to maximize the throughput, before permitting the device to go back to coarse mode.

Another application is dynamic, for devices using zero crossing detectors the resolution around mid-scale is more important that at the signal extremes. The DCA can engage more converters in a specific signal region and disengage them dynamically, when the signal leaves the region, thereby saving power and input loading effects.

FIG. 8 is a flowchart illustrating a method for dynamically configuring data conversion. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 provides a data conversion array (DCA) with a plurality of selectively engageable data conversion circuits for the conversion of analog input signals to digital output signals. In Step 804 the DCA converts analog input signals to digital output signals using a first data conversion circuit. In Step 806 the DCA receives a configuration signal. In response to the configuration signal, the DCA in Step 808 converts analog input signals to digital output signals using a second data conversion circuit. This method is conducive to changing the techniques that are being using to convert analog to digital signals, on-the-fly. For example, the ability to switch between processing techniques may be useful if a data conversion module is being used to sequentially process different analog data channels, or if the qualities of data change in a single channel system.

The first and second data conversion circuits of Steps 804 and 808 may be selected from configurable data resolution circuits, configurable data conversion speed circuits, or both configurable data resolution and configurable data conversion speed circuits, as described above in the explanation of FIGS. 3A through 3C. With respect to the above-mentioned configurable data resolution circuits, they may be selected from averaging (FIGS. 4A and 4B), oversampling (FIG. 5), multi-stage pipelining (FIGS. 6A and 6B), or combinations of the above-listed circuits.

FIG. 9 is a flowchart illustrating another method for configurable data conversion. The method begins at Step 900. Step 902 provides a DCA with a plurality of selectively engageable data conversion circuits for the conversion of analog input signals to digital output signals. In Step 904 the DCA receives a configuration signal. In response to receiving the configuration signal, the DCA in Step 906 selects a first data conversion circuit. In Step 908 the DCA receives analog input signals. In Step 910 the DCA processes the analog input signals using the first data conversion circuit. In Step 912 the DCA supplies digital output signals. This method may be useful, for example, as a final process in the fabrication of data conversion modules, prior to shipment to a customer. Alternatively, the method might be useful for the configuration of a data conversion module by the customer during the fabrication of a higher level system.

The first data conversion circuit of Step 906 may be selected from configurable data resolution circuits, configurable data conversion speed circuits, or both configurable data resolution and configurable data conversion speed circuits, as depicted in FIGS. 3A through 3C. With respect to the above-mentioned configurable data resolution circuits, they may be selected from averaging (FIGS. 4A and 4B), oversampling (FIG. 5), multi-stage pipelining (FIGS. 6A and 6B), or combinations of the above-listed circuits.

In one aspect, the DCA processing received analog input signals using the configurable data resolution averaging circuit in Step 910 comprises parallelly sampling a first analog input signal a plurality of instances. Then, supplying the digital output signals comprises the following substeps. Step 912*a* supplies digital output signals with a first SNR in response to each analog input signal sample. Step 912*b* averages the digital output signals, and Step 912*c* supplies an averaged digital output signal with a second SNR, greater than the first SNR. In one aspect, parallelly sampling the first analog input signal the plurality of instances in Step 912*a* comprises selecting the number of instances the first analog signal is sampled per sample period.

In another aspect, the DCA processing received analog input signals using the configurable data resolution oversampling circuit in Step 910 comprises sampling an analog input signal having a first signal frequency, at a first clock frequency, greater than the first signal frequency. Then, supplying digital output signals in Step 912 comprises the following substeps. Step 912*d* supplies a digital output signal having a first SNR. Step 912*e* samples the digital output signal at a second clock frequency, greater than or equal to the first signal frequency, and Step 912 *f* supplies an oversampled digital output signal having a second SNR, greater than the first SNR. In one aspect, sampling the analog input signal in Step 910 includes selecting the first clock frequency, and sampling the digital output signal in Step 912*e* includes selecting the second clock frequency.

In another aspect, the DCA processing the received analog input signals using the configurable data resolution multi-stage pipelining circuit in Step 910 comprises the following substeps. Step 910*a* supplies a first analog input signal to a first stage in a plurality of series-connected stages. In Step 910*b* each non-final stage supplies an analog output signal to an analog input of a subsequently connected stage in response to comparing a received analog input signal to a quantized value of the received analog input signal. Step 910*b* also amplifies an analog signal comparison residue. Supplying the digital output signals in Step 912 comprises the following substeps. Step 912*f* sums the digital output signal of each stage. Step 912*g* supplies a summed digital output signal with a resolution responsive to the number of successively connected stages. In one aspect, supplying the first analog input signal to the first stage in the plurality of series-connected stages in Step 910*a* includes selecting the number of series-connected stages in the plurality. In addition, Step 910*a* selects the order of stages, meaning which stages are bypassed.

In another aspect, the DCA processing the received analog input signals using the configurable data speed circuit in Step 910 comprises sampling a first analog input signal using a first clock having a first frequency with a first plurality of clock phases. Then, supplying the digital output signals in Step 912 comprises the following substeps. Step 912*h* supplies a first plurality of digital output signals at a first data rate in response to sampling the first analog input signal. Step 912*i* interleaves the first plurality of digital output signals. Step 912*j* supplies an interleaved digital output signal having a second data rate, greater than the first data rate. In some aspects, sampling the first analog input signal in Step 910 comprises selecting the number of clock phases in the first plurality of clock phases (i.e. selecting the number of samples used).

A data converter module, as well as methods for configurable data conversion, has been provided. Examples of particular types of ADC devices and digital processes techniques have been presented to illustrate the invention. However, the invention is not limited to any particular type or style of ADC, data resolution, or data speed circuit. Other variations and embodiments of the invention will occur to those skilled in the art.

I claim:

1. A data converter module comprising:
an analog interface to receive analog input signals;
a digital interface to transmit digital output signals;
a configuration interface to accept analog-to-digital conversion algorithm signals from a source external to the data conversion module;

a data conversion array (DCA) with a plurality of selectively engageable data conversion circuits for the conversion of the analog input signals to the digital output signals, where the data conversion circuits are responsive to the analog-to-digital conversion algorithm signals; and, wherein the plurality of selectively engageable data conversion circuits use analog-to-digital conversion algorithms selected from a group consisting of averaging, oversampling, multi-stage pipelining, interleaving, and combinations of the above-listed algorithms.

2. The data converter module of claim 1 wherein a plurality of the selectively engageable data conversion circuits are arranged in parallel, each connected to the analog and digital interfaces.

3. The data converter module of claim 1 wherein a DCA averaging circuit comprises:

a plurality of analog-to-digital converters (ADCs), each ADC having an analog input to accept an analog input signal and a digital output to supply a digital output signal with a first signal-to-noise ratio (SNR) in response to sampling the analog input signal; and, an averager having a plurality of inputs, each input connected to a corresponding ADC digital output, the averager having an output to supply an averaged digital output signal with a second SNR, greater than the first SNR.

4. The data converter module of claim 3 wherein the DCA averaging circuit comprises a selectively engageable number of ADCs.

5. The data converter module of claim 1 wherein a DCA oversampling circuit comprises:

an ADC having an analog input to accept an analog input signal having a first signal frequency, a digital output to supply a digital output signal having a first SNR, and a clock input for accepting a first clock signal having a first clock frequency greater than the first signal frequency, where the analog signal is sampled at the first clock frequency; and, a digital decimation filter having an input to accept the ADC digital output signal, a clock input for accepting a second clock signal having a second clock frequency, greater than or equal to the first signal frequency, and a digital output to supply an oversampled digital output signal having a second SNR, greater than the first SNR.

6. The data converter module of claim 5 wherein the ADC accepts the first clock signal having a selectable first clock frequency; and, wherein the digital decimation filter accepts the second clock having a selectable second clock frequency.

7. The data converter module of claim 1 wherein the DCA interleaving circuit comprises:

a clock having a first plurality of clock outputs to supply a first clock signal at a first frequency with a first plurality of clock phases, each clock output being associated with a unique clock phase;

a first plurality of ADCs, each ADC having an input to accept an analog input signal, a clock input to accept a corresponding first clock signal clock phase, and an output to supply a digital output signal at a first data rate in response to sampling the analog input signal at the first frequency; and, an interleaver having inputs connected to the first plurality of ADC digital outputs, and an output to supply an interleaved digital output signal having a second data rate, greater than the first data rate.

8. The data converter module of claim 7 wherein the first plurality of ADCs are a first plurality of selectively engageable ADCs; and, wherein the clock has a phase selection input for selecting a number of phases in the first plurality of clock phases equal to the number of selected ADCs.

9. The data converter module of claim 1 wherein a DCA multi-stage pipelining circuit comprises:

a plurality of stages connected in series, where each stage accepts an analog input signal and supplies a digital output signal in response to sampling the analog signal, and where each non-final stage supplies an amplified analog residue signal to a subsequently connected stage in response to comparing a quantized version of the analog input signal to the analog input signal;

a digital summer to accept the digital output signal of each stage, and supply a summed digital signal; and, wherein the resolution of the summed digital signal is responsive to the number of successively connected stages.

10. The data converter module of claim 9 wherein the DCA multi-stage pipelining circuit comprises a selectively connectable plurality of stages.

11. A method for dynamically configuring data conversion, the method comprising:

providing a data conversion array (DCA) with a plurality of selectively engageable data conversion algorithms for the conversion of analog input signals to digital output signals, wherein the data conversion algorithms are selected from a group consisting of averaging, oversampling, multi-stage pipelining, and interleaving;

the DCA converting analog input signals to digital output signals using a first data conversion algorithm;

the DCA receiving an analog-to-digital conversion algorithm signal from a source external to the DCA; and, in response to the analog-to-digital conversion algorithm signal, the DCA converting analog input signals to digital output signals using a second data conversion algorithm.

12. The method of claim 11 wherein providing the DCA includes providing a DCA with a plurality of data conversion circuits arranged in parallel, each selectively engaged to convert analog signals to digital signals.

13. A method for configurable data conversion, the method comprising:

providing a data conversion array (DCA) with a plurality of selectively engageable data conversion algorithms for the conversion of analog input signals to digital output signals, wherein the plurality of selectively engageable data conversion algorithms are selected from a group consisting of averaging, oversampling, multi-stage pipelining, and interleaving;

the DCA receiving an analog-to-digital conversion algorithm signal from a source external to the DCA;

in response to receiving the analog-to-digital conversion algorithm signal, the DCA selecting a first data conversion algorithm;

the DCA receiving analog input signals;

the DCA processing the analog input signals using the first data conversion algorithm; and, the DCA supplying digital output signals.

14. The method of claim 14 wherein providing the DCA includes providing a DCA with a plurality of data conversion circuits arranged in parallel, each selectively engaged to convert analog signals to digital signals.

15. The method of claim 13 wherein the DCA processing received analog input signals using the averaging algorithm comprises parallelly sampling a first analog input signal a plurality of instances;
   wherein supplying the digital output signals comprises:
      supplying digital output signals with a first signal-to-noise ratio (SNR) in response to each analog input signal sample;
      averaging the digital output signals; and,
      supplying an averaged digital output signal with a second SNR, greater than the first SNR.

16. The method of claim 15 wherein parallelly sampling the first analog input signal the plurality of instances comprises selecting a number of instances the first analog signal is sampled.

17. The method of claim 13 wherein the DCA processing received analog input signals using the oversampling algorithm comprises sampling an analog input signal having a first signal frequency, at a first clock frequency, greater than the first signal frequency;
   wherein supplying digital output signals comprises:
      supplying a digital output signal having a first SNR;
      sampling the digital output signal at a second clock frequency, greater than or equal to the first signal frequency; and,
      supplying an oversampled digital output signal having a second SNR, greater than the first SNR.

18. The method of claim 17 wherein sampling the analog input signal includes selecting the first clock frequency; and,
   wherein sampling the digital output signal includes selecting the second clock frequency.

19. The method of claim 13 wherein the DCA processing the received analog input signals using the multi-stage pipelining algorithm comprises:
   supplying a first analog input signal to a first stage in a plurality of series-connected stages;
   each non-final stage supplying an analog output signal to an analog input of a subsequently connected stage in response to comparing a received analog input signal to a quantized value of the received analog input signal, and amplifying an analog signal comparison residue;
   wherein supplying the digital output signals comprises:
   summing the digital output signal of each stage; and,
   supplying a summed digital output signal with a resolution responsive to the number of successively connected stages.

20. The method of claim 19 wherein supplying the first analog input signal to the first stage in the plurality of series-connected stages includes selecting a number of series-connected stages in the plurality.

21. The method of claim 13 wherein the DCA processing the received analog input signals using the interleaving algorithm comprises sampling a first analog input signal using a first clock having a first frequency with a first plurality of clock phases;
   wherein supplying the digital output signals comprises:
      supplying a first plurality of digital output signals at a first data rate in response to sampling the first analog input signal;
      interleaving the first plurality of digital output signals; and,
      supplying an interleaved digital output signal having a second data rate, greater than the first data rate.

22. The method of claim 21 wherein sampling the first analog input signal comprises selecting a number of clock phases in the first plurality of clock phases.

23. A data converter module comprising:
   an analog interface to receive analog input signals;
   a digital interface to transmit digital output signals;
   a configuration interface to accept analog-to-digital conversion algorithm signals from a source external to the data conversion module;
   a data conversion array (DCA) with a plurality of selectively engageable data conversion circuits for the conversion of the analog input signals to the digital output signals, where the data conversion circuits are responsive to the analog-to-digital conversion algorithm signals; and,
   wherein the plurality of selectively engageable data conversion circuits are selected from a group consisting of configurable averaging circuits, configurable oversampling circuits, configurable multi-stage pipelining circuits, configurable interleaving circuits, and combinations of the above-listed circuits.

\* \* \* \* \*